United States Patent
Kwon et al.

(10) Patent No.: US 6,249,056 B1
(45) Date of Patent: Jun. 19, 2001

(54) LOW RESISTANCE INTERCONNECT FOR A SEMICONDUCTOR DEVICE AND METHOD OF FABRICATING THE SAME

(75) Inventors: Dong-chul Kwon, Suwon; Young-Jin Wee, Seoul, both of (KR)

(73) Assignee: Samsung Electronics Co., Ltd., Swon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/431,695

(22) Filed: Nov. 1, 1999

Related U.S. Application Data

(62) Division of application No. 09/134,183, filed on Aug. 14, 1998.

(30) Foreign Application Priority Data

Aug. 16, 1997 (KR) .................................. 97-39092

(51) Int. Cl.$^7$ ........................ H01L 23/48; H01L 23/52; H01L 29/40

(52) U.S. Cl. .................. 257/758; 257/751; 257/763; 257/764; 257/765; 257/770

(58) Field of Search ................................. 257/758, 751, 257/763–765, 770

(56) References Cited

U.S. PATENT DOCUMENTS 5,635,763 * 6/1997 Inoue et al. ....................... 257/763

* cited by examiner

*Primary Examiner*—Sara Crane
*Assistant Examiner*—Thien F. Tran
(74) *Attorney, Agent, or Firm*—Marger Johnson & McCollom, P.C.

(57) ABSTRACT

The present invention provides a structure and a method for formation of interconnect having a barrier layer, aluminum layer on the barrier layer, a reaction prevention layer on the aluminum layer, an antireflective coating layer on the reaction prevention layer, a dielectric layer, a via, a conductive plug, and another aluminum layer on the via and the dielectric layer. This structure prevents interconnects from contact resistance failure caused by an aluminum nitride film AlF, a titanium fluorine film $Ti_xFF$, aluminum overetching, and aluminum consumption. As a result of this invention, via electromigration and aluminum line electromigration characteristics are improved in semiconductor devices.

9 Claims, 4 Drawing Sheets

LOW RESISTANCE INTERCONNECT FOR A SEMICONDUCTOR DEVICE AND METHOD OF FABRICATING THE SAME

This application is a divisional of U.S. application No. 09/134,183 filed Aug. 14, 1998 now pending.

FIELD OF THE INVENTION

The present invention relates to semiconductor devices, and more particularly to interconnections having a multi-level metal structure and process for fabricating the structure.

BACKGROUND OF THE INVENTION

The density of semiconductor devices continues to increase due to decreasing semiconductor feature sizes. In order to minimize chip size, the techniques related to manufacturing process, device physics, and reliability in the field of sub-micron semiconductor devices are continually being challenged, developed, and refined.

The metallization process provides interconnections between contacts within semiconductor devices and between devices and conductive pads. To make electrical connections in smaller and more complex chips, multilevel metal interconnects are formed in the semiconductor process. The metal interconnect may be composed of Al, Ti, Cu, W, or other suitable conductive material or combination. A recess such as hole or via is bored through a dielectric covering a first level layer of metal, or a second level layer of metal. The recess is filled with a conductive material (i.e. Al, Ti, Cu, W). The conductive material in the via provides an electrical connection between the first metal layer and the second metal layer or between any two metal layers.

In VLSI multilevel metallization structures, reliability problems of the via can be associated with the aspect ratio of the via, step conditions of the metallization process and materials used in fabricating the via.

FIG. 1 illustrates a step of a conventional interconnection process etching through a dielectric layer 16 into capping layer 14 for forming a via to the conductive layer 12, which is formed on semiconductor layer 10 having a barrier layer (not shown). Unfortunately it is difficult to precisely etch the capping layer 14 through the dielectric layer 16 without etching the underlaying conductive layer 12. When overetching the conductive layer (i.e. Al) 12, the chemical etchant (i.e. $CF_4$, $CBF_3$) reacts with the aluminum layer 12 and produces an AlF series polymer 20 on the walls of the via or the bottom of the via, which has a higher electrical resistance than the aluminum layer 12. The high contact resistance of polymer 20 may induce electrical failure of the via contact. Overetching the aluminum 12 also damages the aluminum layer, which may weaken the electromigration characteristics of the aluminum layer 12.

FIG. 2 illustrates another conventional interconnection process directed to solving the problem of producing the high resistivity AlF series polymer. The conventional process includes the steps of forming an aluminum layer 32 on a barrier layer of a surface of the semiconductor (not shown); forming an intermetallic layer 34 (i.e. titanium aluminum $TiAl_3$) by heating or annealing a titanium layer to react with the underlying aluminum layer 32; forming a titanium nitride layer 36 on the intermetallic layer 34; depositing an interlevel dielectric layer 38 (i.e. silicon dioxide $SiO_2$) on the titanium nitride layer 36; etching a portion of the dielectric layer 38; and depositing a titanium layer 42 and a titanium nitride layer 44 as a glue layer or an antireflective coating layer (ARC layer) on the dielectric layer 38 and the whole surface of the via 40 (see for example U.S. Pat. No. 5,360,995). The intermetallic layer 34 may protect the overetching of the aluminum layer 32 because the intermetallic layer 34 can be an overetching stop layer of the aluminum layer. But the intermetallic layer 34 unfortunately has a high resistivity, which is an undesirable characteristic in a semiconductor device. Despite providing improvements in via 40, the via contact still has problems due to resistivity of the contact and electromigration characteristics of the metal line and via.

SUMMARY OF THE INVENTION

The present invention is intended to solve the problems, and it is an object of the invention to simplify the process and improve the reliability of the via.

It is another object of the invention to provide the reduction of the via resistance in order to improve electromigration characteristics of the via.

It is an additional object of the invention to provide a reduction of the via process steps for manufacturing semiconductor devices.

According to an aspect of the invention, a semiconductor device has a capping layer and a glue layer between a conductive via plug and a conductive layer in order to prevent damage to the conductive layer and preserve the electromigration characteristics of the conductive layer. The glue layer (i.e. titanium nitride TiN) is provided to prevent the production of undesired material during the via etching process. The capping layer is provided to reduce the contact resistance of the via.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

A device structure and method for the fabrication of a via which improves the electrical contact to an underlying metal layer are described below. In the following description, numerous details such as specific materials, chemicals, process parameters and techniques are set forth in order to provide a more thorough understanding of the invention. It will be obvious, however, to those skilled in the art, that the present invention can be practiced without many of these specific details, or by using alternative materials, chemicals or techniques. In other instances, well-known processes, etch equipment and the like are not described in detail in order not to obscure the description of the present invention.

Figure 1:
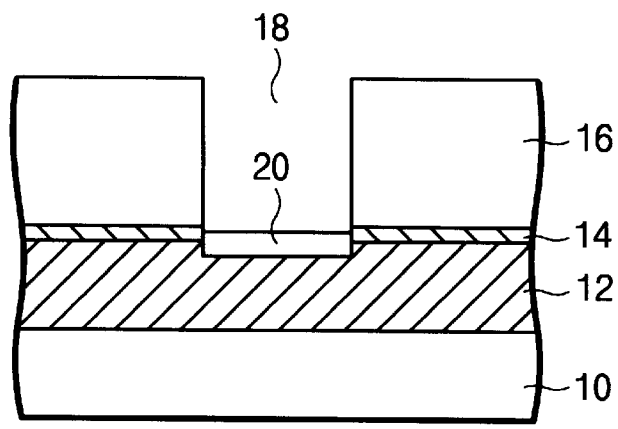
FIG. 1 is a cross-sectional view of a conventional via structure.
Figure 2:
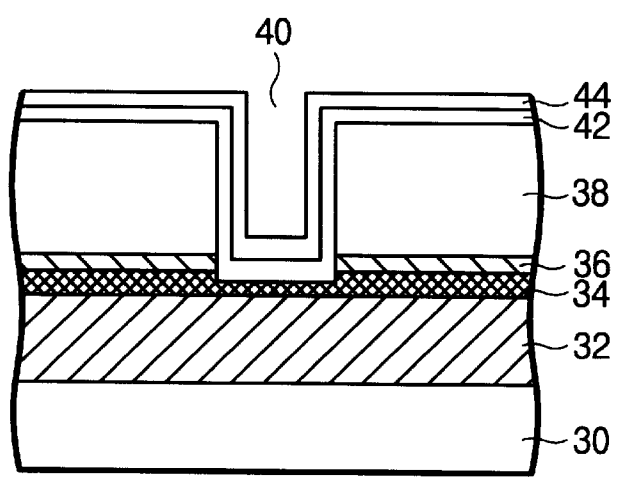
FIG. 2 is a cross-sectional view of another conventional via structure.
Figure 3:
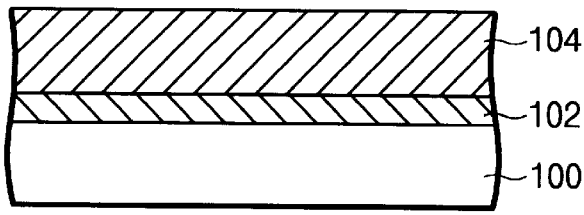
FIG. 3 is a cross-sectional view of a portion of in-process semiconductor wafer according to the present invention after depositing a barrier layer and a conductive metal layer on the wafer.

Referring to FIG. 3, a barrier layer 102 (i.e. Ti, TiN, $WSi_x$) is deposited on a surface of a semiconductor substrate 100 or on an interlevel dielectric layer (not shown) by a sputtering method. The barrier layer 102 may be a single layer or a multilayer of Ti, Ti/TiN, $WSi_x$, Ti/WSi., or another barrier material. A conductive layer 104 (i.e. aluminum, aluminum alloy, copper, copper alloy) is formed on the barrier layer 102 by a well-known sputtering method.

Figure 4:
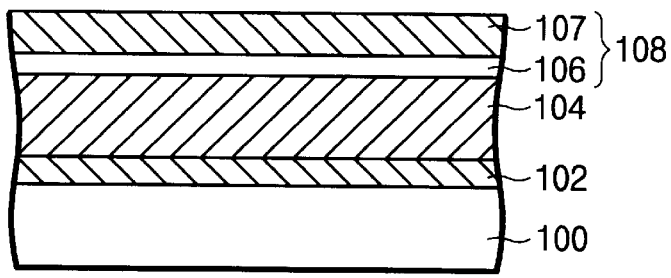
FIG. 4 is a cross-sectional view of a portion of in-process semiconductor wafer according to the present invention in which a capping layer of Ti/TiN is formed on the structure of FIG. 3.

Referring to FIG. 4, a capping layer 108 comprising titanium layer 106 and titanium nitride layer 107 is formed on the aluminum layer 104. After treatment of vacuum break for forming a natural oxide layer on the aluminum layer 104, the titanium layer 106 is deposited to a thickness of between about 150 and about 350 angstroms by a conventional sputtering method at room temperature. The natural oxide layer may be the thickness of between 10 and 40 angstroms. The titanium layer 106 and the natural oxide layer are not an etching stopping layer but operate as a reaction prevention layer. The titanium nitride layer 107 is deposited at room temperature by a sputtering method to a thickness of between about 400 to 700 angstroms. The titanium nitride layer 107 works as an anti-reflective coating layer during the lithography process for patterning the aluminum layer 104. When the titanium nitride layer 107 is formed over the aluminum layer 104 in a nitrogen gas, it does not react with the underlying aluminum layer and does not form a titanium aluminum film $TiAl_3$ on the top surface of the aluminum layer. In the process of depositing the titanium layer 106, the temperature of the titanium layer process may be lower (i.e. room temperature) so that the titanium layer 106 does not react with the underlying aluminum layer 104 and it does not produce $TiAl_3$ film. Resistance failure in the via and poor electromigration characteristics may be happened if $TiAl_3$ is made. Ti and TiN layer are formed in-situ in order to prevent the formation of a natural oxide layer on the Ti layer 106.

Figure 5:
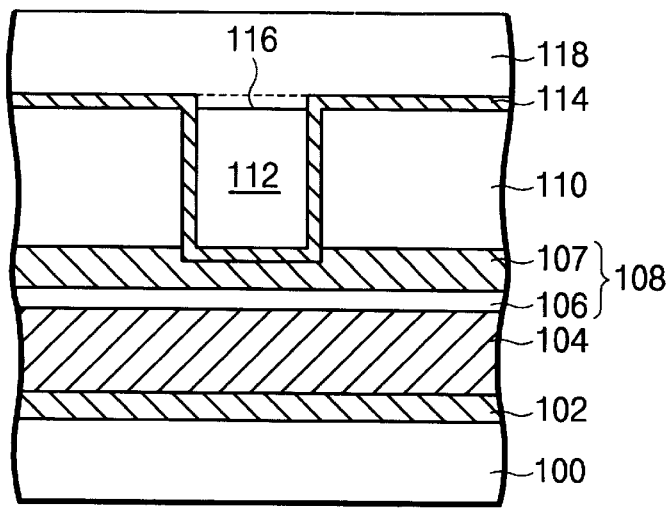
FIG. 5 is a cross-sectional view of a portion of in-process semiconductor wafer according to the present invention showing the structure of FIG. 4 after etching a via and depositing a glue layer and a conductive plug W.

Referring to FIG. 5, an interlevel dielectric (ILD) layer 110, a via hole 112, a glue layer 114 and a conductive plug 116 are formed on the structure shown in FIG. 4. The ILD layer 110, of between about 10,000 and about 12,000 angstroms in thickness, is formed on the TiN layer 107 by chemical vapor deposition (CVD). A portion of the ILD layer 110 is etched to form a via hole through the ILD layer 110 to expose the TiN layer 107. An etchant for the via hole generally contains $CHF_3$ or $CF_4$ based gases. The TiN layer 107 is used for an etching stop layer during etching of the ILD layer 110, which prevents a damage of the underlying aluminum layer 104 and prevents the formation of a polymer (i.e. AlF). The glue layer 114, of between about 700 and about 1,000 angstroms in thickness, is deposited on the He surface of the ILD layer 110 and on the walls and bottom of the via 112. The glue layer 114 is preferably formed of TiN at preferred thickness of about 850 angstroms by a collimated sputtering method at room temperature, which provides good step coverage in the via. The conductive plug 116 (i.e. W, Al, Cu) may be formed on the glue layer 114 by a sputtering method or CVD method. A chemical mechanical polishing (CMP) process follows for polishing the surface of the conductive plug 116 and the ILD layer 114.

If a glue layer 114 is deposited as a Ti/TiN layer (not shown) on the walls and bottom of the via 112. Titanium fluoride ($Ti_xF$) film may be formed on the Ti layer. The reason is that tungsten fluorine gas ($WF_6$) diffuses through the TiN layer to the Ti layer and reacts with the Ti layer during the formation of the tungsten conductive plug 116. The $Ti_xF$ film negatively affects the electromigration characteristics of the semiconductor device. This invention prevents the formation of a $Ti_xF$ film because the glue layer 114 and the TiN layer 107 functions as a buffer layer.

In the next metallization step, an aluminum layer 118 is formed on the surface of the resultant structure on the semiconductor wafer. Another capping layer (i.e Ti/TiN) and insulation layer is deposited and via and plugs are formed for the next metal layer of a multiple metal layer structure. After the metallization steps, a conventional passivation layer is usually formed, such as an oxide layer and a silicon nitride layer. The invention includes other known process and layers having similar functions may be substituted for the disclosed processes.

Figure 6:
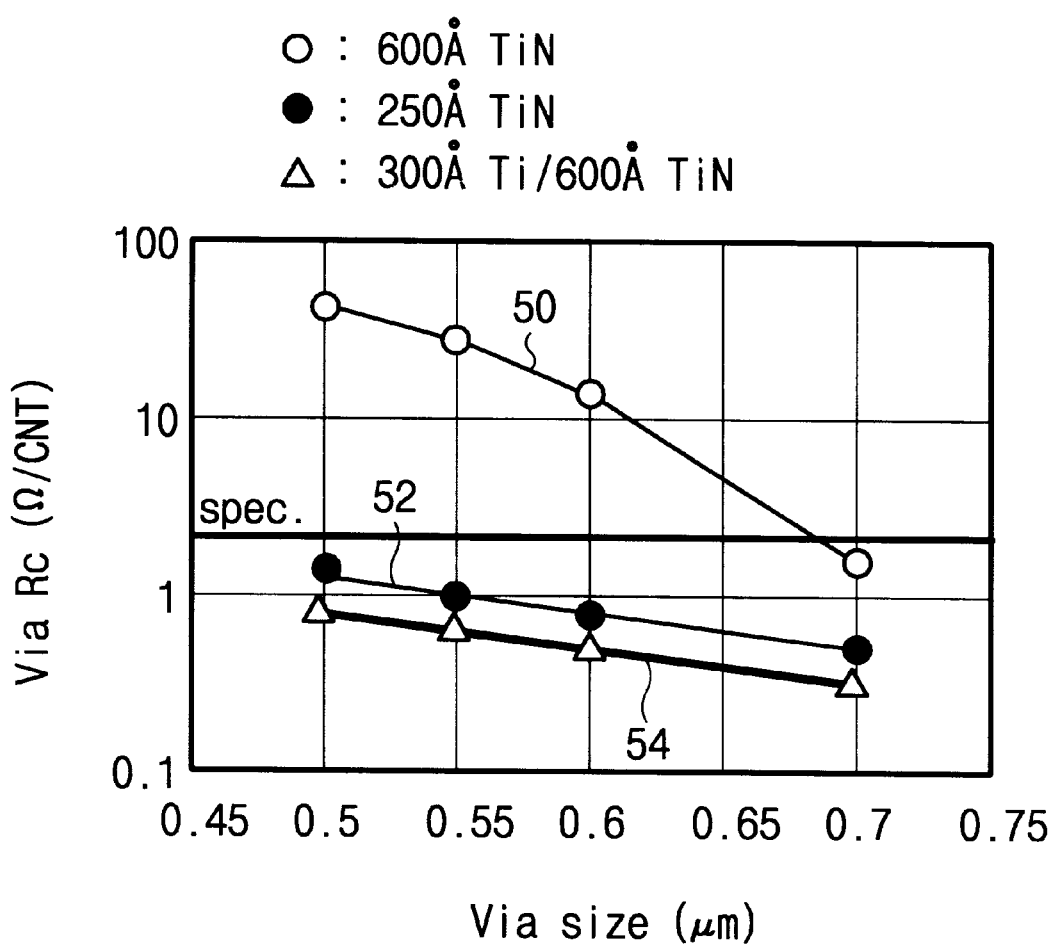
FIG. 6 is a graph that shows the contact resistance according to the thickness of the capping layer.

FIG. 6 illustrates a graph of resistance characteristics according to the thickness of the capping layer and via sizes. To prevent overetching of the aluminum layer 104 while etching an interlevel dielectric (ILD) layer 110, for example, a thicker TiN layer 107 of 600 angstroms in thickness may be deposited on the aluminum layer 104 without a titanium layer 106. The TiN layer 107 has a higher resistance as shown in FIG. 6 by resistance line 50 than does a thin TiN layer 107 of 250 angstroms in thickness as shown by resistance line 52. The reason for this is that a dielectric byproduct film, AlN, is formed on the walls and bottom of a via on the underlying aluminum layer 104 while forming the TiN film 107 in a nitrogen gas. The contact resistance of two layer, Ti/TiN layer 108 is shown in FIG. 6 as resistance line 54. The resistance of the two layer shown by line 54 is similar to that single layer of the TiN shown by line 52.

Figure 7:
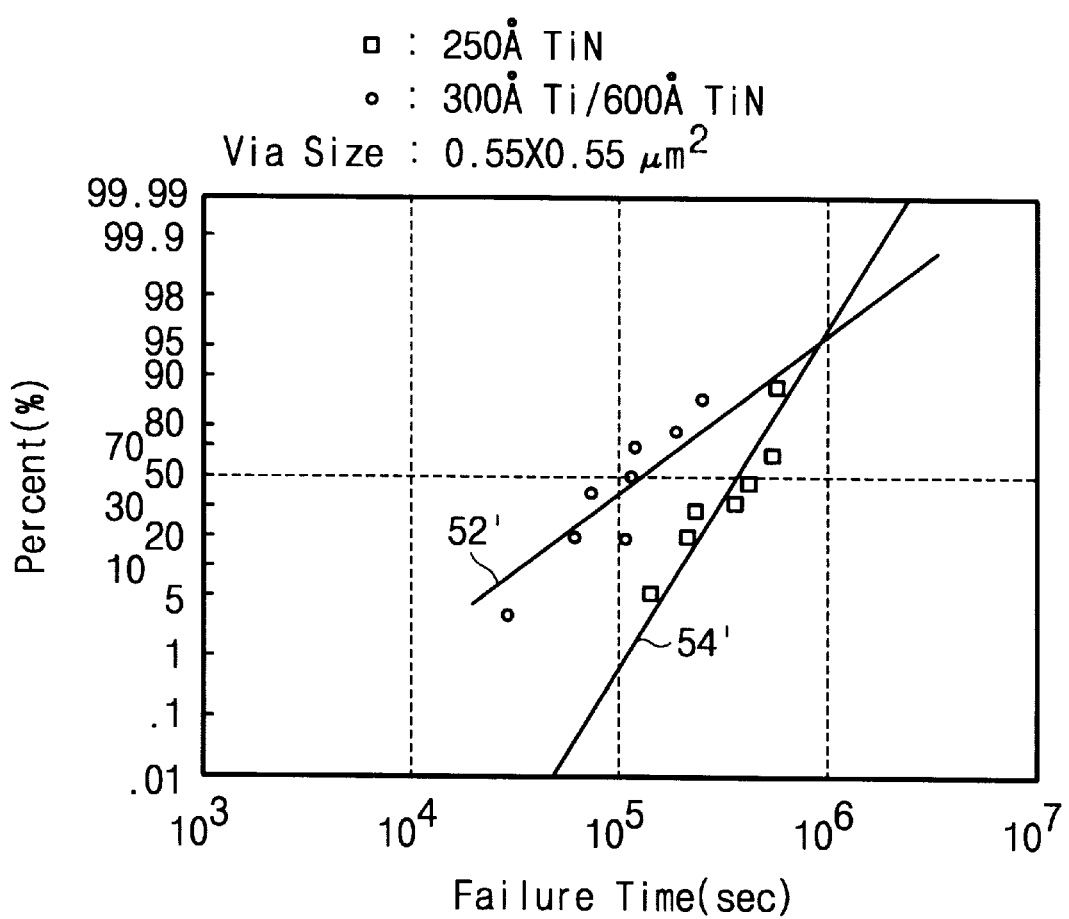
FIG. 7 is a graph that shows the failure distribution of the invention according to type of capping layer.

FIG. 7 illustrates failure datum distribution of the invention according to different capping layers 108 using the same glue layer 114 (i.e. TiN). Capping layer data 54' (i.e. Ti/TiN) and another capping layer data 52' (i.e TiN) are shown in FIG. 7. Ti and TiN layers are used for the capping layer data 54'. TiN layer is used for the capping layer data 52'. The Ti and TiN layer comprises a Ti layer of about 300 angstrom in thickness and a TiN layer of about 600 angstrom in thickness. The TiN layer is about 250 angstrom in thickness. The failure datum distribution of the Ti/TiN layer shows better electromigration characteristics than the failure datum distribution of the TiN layer. Therefore a via having the Ti/TiN capping layer and the TiN glue layer has not only a low resistance and a low failure but also has a simplified process and good reliability.

What is claimed is:

1. An interconnect for a semiconductor device comprising:

a barrier layer over a semiconductor substrate;

a first conductive layer on the barrier layer;

an oxide layer formed on the first conductive layer;

a capping layer comprising a reaction prevention layer and an antireflective coating layer on the oxide layer;

a dielectric layer having a via formed on the antireflective coating layer wherein the via including a top and a bottom extends into the antireflective coating layer;

a single-layer glue layer being directly in contact with the dielectric layer, the single-layer glue lining the via in the dielectric layer;

a conductive plug in the via; and a second conductive layer overlying the conductive plug and the dielectric layer.

2. The interconnect of claim 1, wherein the barrier layer is selected from the group consisting of titanium, titanium nitride, tungsten silicon, and combinations thereof.

3. The interconnect of claim 1, wherein the reaction prevention layer is for preventing a reaction between the first conductive layer and the antireflective coating layer.

4. The interconnect of claim 1, wherein the reaction prevention layer is titanium, Ti.

5. The interconnect of claim 1, wherein the antireflective coating layer and the glue layer are titanium nitride, TiN.

6. The interconnect of claim 1, wherein the conductive plug is tungsten, W.

7. The interconnect of claim 1, wherein the antireflective coating layer and the glue layer are the same material and the reaction prevention layer is formed at room temperature.

8. The interconnect of claim 1, wherein the antireflective coating layer and the reaction prevention layer are formed in-situ.

9. The interconnect of claim 1, wherein the first conductive layer is formed of aluminum and the oxide layer is formed of aluminum oxide having a thickness of 10–40 angstroms.

* * * * *

UNITED STATES PATENT AND TRADEMARK OFFICE
CERTIFICATE OF CORRECTION

PATENT NO. : 6,249,056 B1
DATED : June 19, 2001
INVENTOR(S) : Kwon et al.

Page 1 of 1

It is certified that error appears in the above-identified patent and that said Letters Patent is hereby corrected as shown below:

<u>Title page,</u>
ABSTRACT,
Line 9, "$Ti_xFF$," should read -- $Ti_xFF$ --

<u>Column 1,</u>
Line 47, "$CBF_3$" should read -- $CHF_3$ --

<u>Column 3,</u>
Line 12, "Ti/Wsi." should read -- $Ti/WSi_x$ --
Lines 56 and 57, "the He surface" should read -- the surface --
Line 67, "112. Titanium" should read -- 112, titanium --

<u>Column 4,</u>
Line 1, "layer. The" should read -- layer; the --
Line 9, "layer 118 is" should read -- layer is --
Line 63, "glue lining" should read -- glue layer lining --

Signed and Sealed this

Sixteenth Day of April, 2002

Attest:

JAMES E. ROGAN
*Attesting Officer*     *Director of the United States Patent and Trademark Office*